United States Patent [19]

Ogawa et al.

[11] Patent Number: 4,805,057

[45] Date of Patent: Feb. 14, 1989

[54] MAGNETIC HEAD DRIVING APPARATUS

[75] Inventors: Toshio Ogawa; Akira Ando, both of Nagaokakyo, Japan

[73] Assignee: Murata Manufacturing Co., Ltd., Japan

[21] Appl. No.: 41,597

[22] Filed: Apr. 22, 1987

[30] Foreign Application Priority Data

Apr. 23, 1986 [JP] Japan .................................. 61-95098

[51] Int. Cl.$^4$ ......................... G11B 5/56; G11B 21/24
[52] U.S. Cl. ........................................ 360/109; 360/75
[58] Field of Search ....................... 360/109, 105–107, 360/112–113, 103, 123, 125–126, 75

[56] References Cited

U.S. PATENT DOCUMENTS 4,151,569  4/1979  Hathaway .................. 360/109 X
4,423,451  12/1983  Chi ............................ 360/125
4,438,469  3/1984  Ohba et al. ................. 360/109
4,713,710  12/1987  Soda et al. .................. 360/121

Primary Examiner—John H. Wolff
Attorney, Agent, or Firm—Ostrolenk, Faber, Gerb & Soffen

[57] ABSTRACT

An apparatus for driving a magnetic head including a monolithic bimorph member. A first end of the monolithic bimorph member has the magnetic head fixed thereto, and the other end thereof is fixed to a support member to be supported by the support member. The monolithic bimorph member comprises a piezoelectric ceramic sintered body formed from a plurality of electrodes stacked alternately with ceramic layers. The plurality of electrodes includes first and second electrode groups which are electrically connected with each other by conductors in through holes. The through holes are provided in portions of the sintered body close to the end fixed to the support member.

11 Claims, 6 Drawing Sheets (a)

(b)

(c)

(d)

(e)

(f)

MAGNETIC HEAD DRIVING APPARATUS

BACKGROUND OF THE INVENTION

1. Field of the Invention

The present invention relates to an apparatus for driving a magnetic head mounted on a rotary cylinder of, e.g., a video tape recorder, and more particularly, it relates to a magnetic head driving apparatus employing a monolithic piezoelectric bimorph element.

2. Description of the Prior Art

FIG. 14 shows an example of a conventional magnetic head driving mechanism of a video tape recorder. A magnetic head 2 is fixed to an end of a monolithic bimorph member 1, the other end of which is fixed to and supported by a support member 3. As shown in FIG. 15, the monolithic bimorph member 1 comprises a sintered body wherein a plurality of electrodes 4 to 8 are stacked alternating with a plurality of ceramic layers. The electrodes 4, 6 and 8 are electrically connected with each other by a connecting electrode 11 formed by coating conductive paste on an end surface of the sintered body. The electrodes 5 and 7 are connected respectively to conductive parts 12a and 12b formed on the other end surface of the sintered body, at which end surface the electrodes 5 and 7 are partially exposed. The conductive parts 12a and 12b are electrically connected with each other by a connecting electrode 13, whereby the electrodes 5 and 7 are electrically connected with each other.

The aforementioned monolithic bimorph member 1 is obtained in the following procedure: A sintered body 21 is prepared as shown in FIG. 16 and then the electrode 5 is supplied with a potential of V volts, the electrode 7 is supplied with a potential of −V volts and the electrodes 4, 6 and 8 are supplied with potentials of zero volts as typically shown in FIG. 17, to polarize the ceramic layers interposed between the electrodes 4 to 8 in the directions shown by arrows in FIG. 17. Then the conductive parts 12a and 12b are connected by the connecting electrode 13 as hereinabove described, thereby to obtain the monolithic bimorph member 1.

Since the monolithic bimorph member 1 comprises the sintered body 21, the ceramic layers interposed between the electrodes 4 to 8 can be reduced in thickness, thereby to increase the amount of displacement per applied voltage. Thus, the magnetic head 2 can be displaced by low voltage in the structure as shown in FIG. 14.

In the aforementioned structure, however, it is difficult to fix the magnetic head 2 in a correct attitude. Namely, the electrodes 4, 6 and 8 of the monolithic bimorph member 1 are electrically connected with each other by the connecting electrode 11, which is formed by coating conductive paste on the end surface of the sintered body 21. Thus, the conductive paste must be coated to reliably extend over the upper and lower edges of the end surface of the sintered body 21, in order to securely connect the electrodes 4 and 8 with each other. As a result, the connecting electrode 11 is hardened with its upper portion upwardly extending beyond the upper surface of the sintered body 21, i.e., beyond the electrode 4, as shown in an enlarged manner in FIG. 18. This, it is extremely difficult to fix the magnetic head 2 with its lower surface parallel with the electrode 4, and therefore the magnetic head z is apt to be fixed with an inclined attitude with respect to the body 21, as shown in FIG. 18.

On the other end of the monolithic bimorph member 1, the conductive paste for forming the conductive parts 12a and 12b extends over the lower surface 21a of the sintered body 21 since the sintered body 21 is small in thickness (about 300 μm). Thus, it is extremely difficult to fix the monolithic bimorph member 1 in a correct attitude to the support member 3 as shown in FIG. 19 in an enlarged manner.

The aforementioned problem also takes place in the case where the connecting electrode 11 and the conductive parts 12a and 12b are Ag baked electrodes, since the sintered body 21 is considerably small in thickness.

SUMMARY OF THE INVENTION

Accordingly, an object of the present invention is to provide a magnetic head driving apparatus employing a monolithic bimorph member, on which a magnetic head can be fixed in a correct attitude.

The apparatus according to the present invention comprises a monolithic bimorph member having an end fixed a magnetic head fixed to one end thereof and a support member to which the other end of the monolithic bimorph member is fixed to support the monolithic bimorph member.

The monolithic bimorph member is structured comprising a piezoelectric ceramic sintered body wherein a plurality of electrodes are stacked alternately with a plurality of ceramic layers. The plurality of electrodes include a first electrode group connected to one of two potentials for driving the apparatus, and a second electrode group connected to another potential. The electrodes forming the respective electrode groups are electrically connected with each other by conductive paths formed in through holes.

The through holes for connecting the electrodes forming one or both of the first electrode group and the second electrode group are formed near the end of the bimorph member fixed to the support member. Other through holes are formed near the end fixed to the magnetic head.

According to the present invention, the electrodes of the monolithic bimorph member are electrically connected with each other by the conductive paths formed at the through holes. Thus, the electrode does not bulge in any of the surfaces of the monolithic bimorph member to be fixed to the magnetic head and fixed to the support member, whereby the magnetic head can be accurately mounted on the monolithic bimorph member in a correct direction and hence can be mounted in a correct attitude on the support member. Thus, a magnetic head displacing mechanism can be formed having high accuracy.

As indicated above, the through holes for connecting the electrodes forming one or both of the electrode groups are provided in the vicinity of the end of the bimorph member fixed to the support member. Therefore, a hot side potential, which preferably should not be in proximity to the magnetic head, can be applied from a position close to the support member to further accurately displace the magnetic head.

These and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 1 to 6 are diagrams for illustrating a first embodiment of the present invention.

Figure 1:
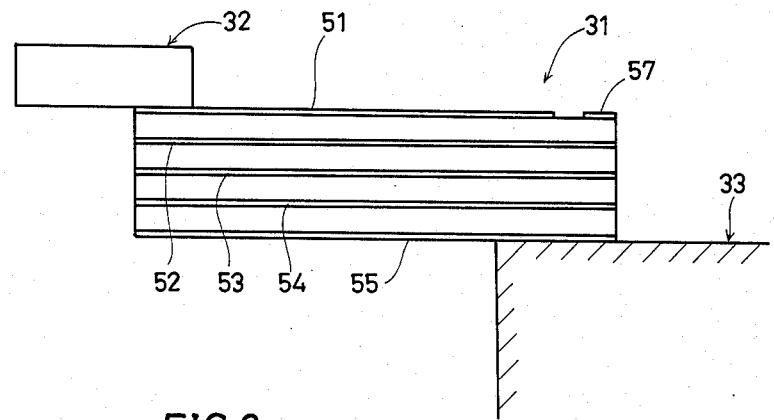
FIG. 1 is a side elevational view showing an embodiment of the present invention.

Referring to FIG. 1, a magnetic head 32 is fixed to an end of a monolithic bimorph member 31. The other end of the monolithic bimorph member 31 is fixed to a support member 33. The monolithic bimorph member 31 of this embodiment has the following structure, which permits the magnetic head 32 to be mounted in a correct attitude with respect to the monolithic bimorph member 31, as well as to the support member 33.

The monolithic bimorph member 31 comprises a sintered body (FIG. 5), which is obtained by coating electrode paste members 51 to 55 on ceramic green sheets 41 to 44 at FIGS. 4(a) to (e) then stacking and baking the same. The electrode paste member 55 is coated on the lower surface of the ceramic green sheet 44.

Figure 3:
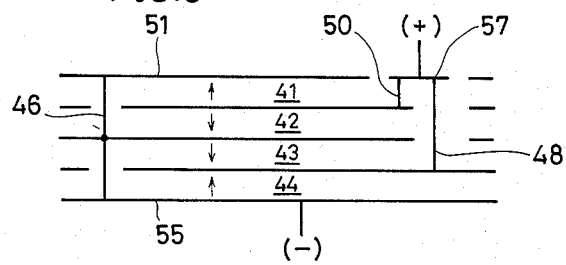
FIG. 3 illustrates a typical electric connection arrangement in the embodiment of FIG. 1.

The ceramic green sheets 41 to 44 are provided near first ends thereof (at the left in FIG. 4) with through-hole members 41a to 44a coated with conductive paste. The electrodes 52 and 54 are formed on the ceramic green sheets 42 and 44 provided with the through-hole members 42a and 44a, but the electrodes 52 and 54 are not to be in contact with the through-hole members 42a and 44a. In the sintered body obtained after stacking and baking, therefore, the through-hole members 41a to 44a define a through hole 46 as shown in FIG. 3, so that the electrodes 51, 53 and 55 are electrically connected with each other by a conductive path formed in the through hole 46.

On the other hand, the ceramic green sheets 41, 42 and 43 are provided on second ends thereof (at the right in FIG. 4) with through-hole members 41b, 42b and 43b coated with conductive paste, in order to define a through hole 48. An extracting electrode 47 is formed around the through-hole member 41b. As shown in the electrode connection diagram of FIG. 6, the electrode 54 is connected to the extracting electrode 47 by a conductive path of the through hole 48 defined by the through-hole members 41b to 43b. Similarly, a through-hole member 41c coated with conductive paste in its inner peripheral surface and an extracting electrode 49 are formed on the second end of the ceramic green sheet 41. The electrode 52 is connected to the extracting electrode 49 through a conductive path in a through hole 50 defined by the through-hole member 41c.

Figure 6:
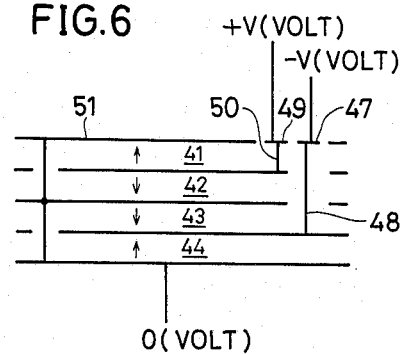
FIG. 6 illustrates a typical electrical connection arrangement for the sintered body shown in FIG. 5.

In the sintered body shown in FIG. 6, the extracting electrodes 49 and 47 and the electrode 51 are supplied with voltages of V volts, −V volt and zero volts respectively, thereby to polarize the respective ceramic layers 41 to 44 in the directions shown by the arrows in FIG. 6.

Figure 2:
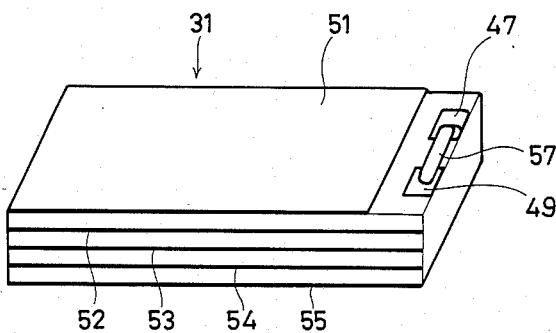
FIG. 2 is a perspective view showing a monolithic bimorph member employed in the embodiment of FIG. 1.

In the sintered body formed in the aforementioned manner, the monolithic bimorph member 31 is obtained by electrically connecting the extracting electrodes 47 and 49 by a conductive part 57 formed by a coating of conductive paint as shown in FIG. 2. FIG. 3 shows schematically an electrically connected arrangement of the electrodes 47 and 49 of the monolithic bimorph member 31.

Referring again to FIG. 1, the magnetic head 32 is fixed to the electrode 51 of the aforementioned monolithic bimorph member 31 with an insulative bonding agent (not shown), for example. In the monolithic bimorph member 31 of this embodiment, no conductive paint needs to be coated, as in the conventional case, on the end to which the magnetic head 32 is fixed. Thus, the upper surface of the electrode 51 is so flat that the magnetic head 32 can be accurately fixed to the upper surface of the electrode 51 with a secure surface-to-surface contact.

Also with respect to the support member 33, the electrode 55 can be reliably fixed to part of the support member 33 with a secure surface-to-surface contact since no conductive paint is coated on the other end surface of the monolithic bimorph member 31.

When the support member 33 is made of a conductive material, the number of connection lead wires required for driving the monolithic bimorph member 31 can be reduced by fixing the electrode 55 to the support member 33 by a conductive material such as a conductive bonding agent.

In a magnetic head driving mechanism of a video tape recorder, it is preferable not to run any lead wires for driving the bimorph member 31 in the vicinity of the magnetic head 32. According to this embodiment, the bimorph member 32 can be driven by applying voltages to the conductive part 57 and the electrode 55. Thus, the lead wires for driving the bimorph member 31 can be connected to the end portion that is separated from the magnetic head 32, thereby to reduce noise applied to the magnetic head 32.

Particularly when the hot side potential is applied to the conductive part 57, the electrodes 51 and 55 exposed on the top and bottom surfaces are connected to ground potentials as shown in FIG. 3, thereby to further effectively reduce any adverse influence exerted on the magnetic head 32.

Figure 7:
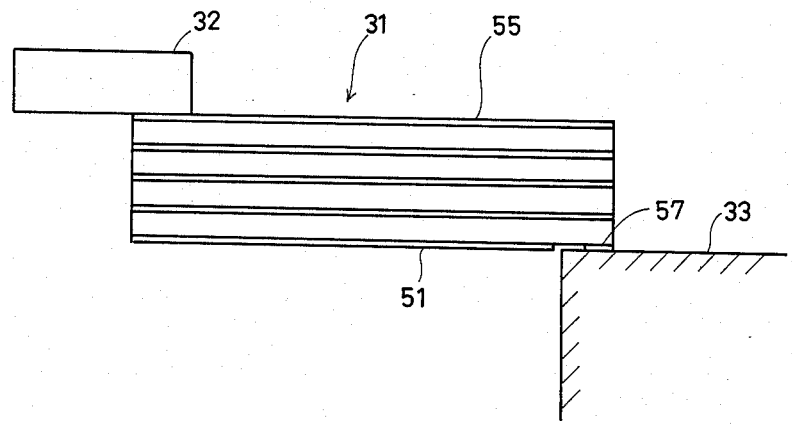
FIG. 7 is a side elevational view showing a modification of the embodiment of FIG. 1, in which the monolithic bimorph member is fixed in a vertically inverted manner.

Referring not to FIG. 7, if the support member 33 is made of a conductive material and adapted to apply the hot side potential, the monolithic bimorph member 31 is fixed to the support member 33 by the conductive part 57 thereof, by applying a conductive material such as a conductive bonding agent, which permits the electrodes 51 and 55 exposed on the surfaces of the monolithic bimorph member 31 to then be connected to ground potentials.

In the embodiment as shown in FIGS. 1 to 7, the through holes 48 and 50 for connecting the electrodes forming one of electrode groups are formed in portions of the monolithic bimorph member 31 that are closer to the support member 33, to provide the conductive part 57 serving as the extracting electrode in the vicinity of the support member 33, whereby the lead wires can be connected to parts of the monolithic bimorph member 31 which are not substantially displaced.

Figure 4:
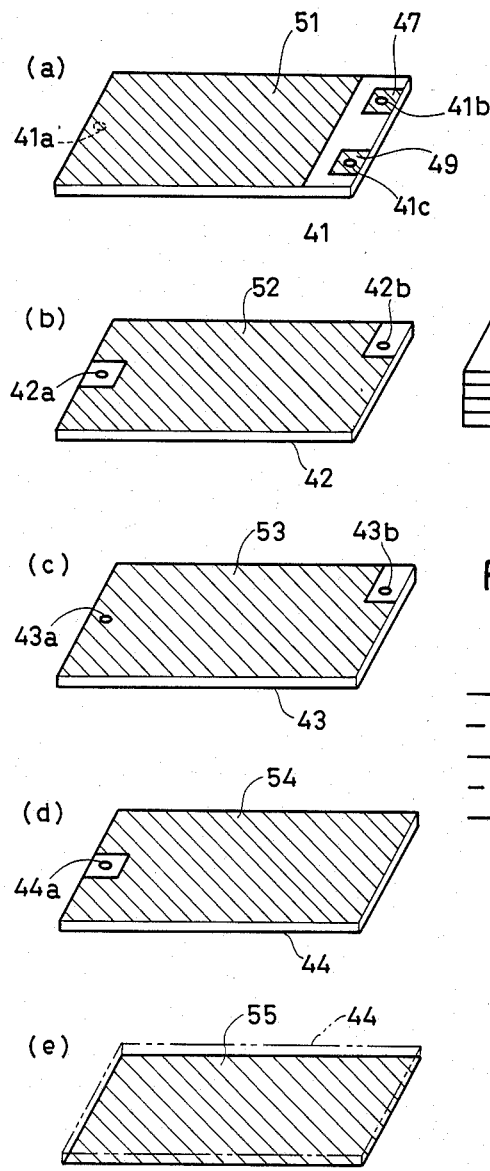
FIGS. 4(a)-(e) is a perspective view illustrating ceramic green sheets and electrode patterns employed in the monolithic bimorph member as shown in FIG. 2.
Figure 5:
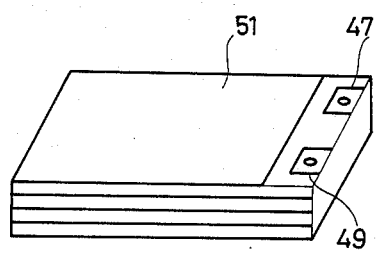
FIG. 5 is a perspective view showing a sintered body obtained by stacking the respective ceramic green sheets shown in FIG. 4 and baking the same.
Figure 8:
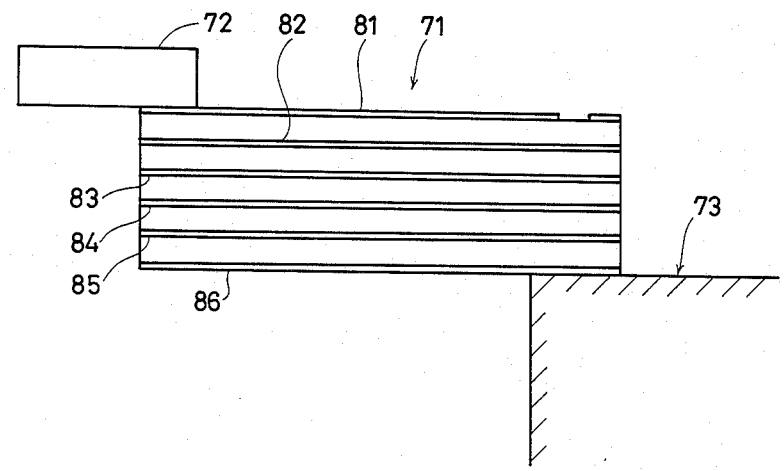
FIG. 8 is a side elevational view showing a second embodiment of the present invention.
Figure 11:
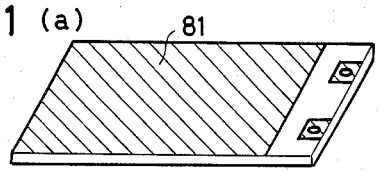
FIGS. 11(a)-(f) is a perspective view illustrating configurations of ceramic green sheets and electrode patterns employed for forming the monolithic bimorph member as shown in FIG. 9.
Figure 11:
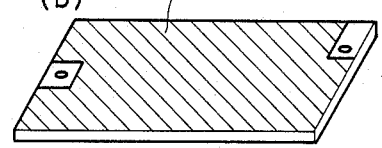

FIG. 8 shows another embodiment of the present invention. A magnetic head 72 is fixed to a first end of a monolithic bimorph member 71, whose second end is fixed to a support member 73. In this embodiment, the monolithic bimorph member 71 has six electrodes 81 to 86. In other words, the monolithic bimorph member 71 is formed with ceramic layers stacked alternately with the electrodes 81 to 86 as shown at FIGS. 11(a) to (f). As seen by comparison with FIG. 4 showing the first embodiment of the present invention, employed in the embodiment of FIG. 11 are two electrodes 83 and 84 which are identical in pattern to the electrode 53 as shown in FIG. 4. Other structure of this embodiment is similar to that of the monolithic bimorph member 31 as shown in FIG. 1.

Figure 9:
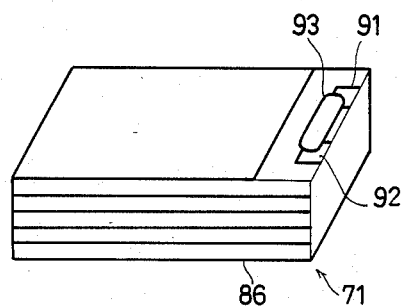
FIG. 9 is a perspective view showing a monolithic bimorph member employed in the embodiment of FIG. 8.
Figure 10:
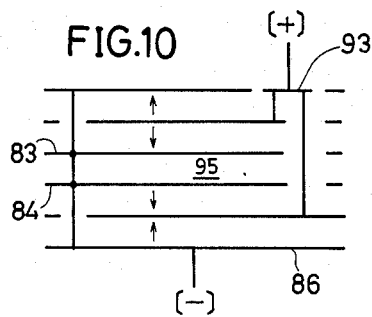
FIG. 10 shows a typical electrical connection arrangement for the monolithic bimorph member shown in FIG. 9.
Figure 10:
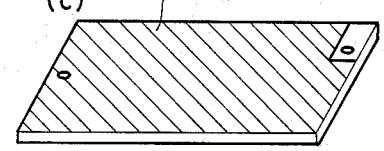
Figure 10:
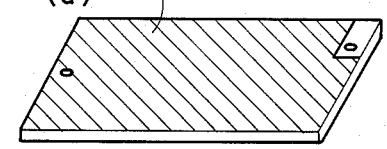
Figure 12:
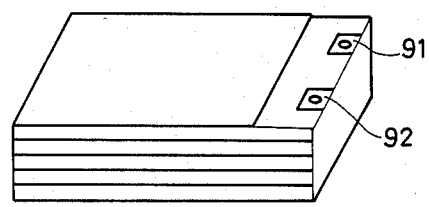
FIG. 12 is a perspective view showing a sintered body obtained by stacking the ceramic green sheets shown in FIG. 11 and baking the same.
Figure 12:
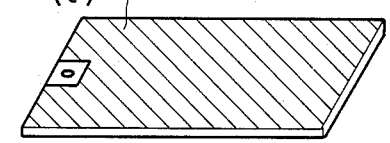
Figure 13:
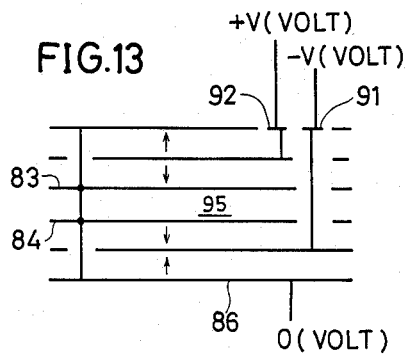
FIG. 13 shows a typical electrical connection arrangement for the sintered body shown in FIG. 12.
Figure 13:
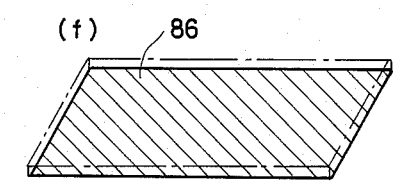

In forming the monolithic bimorph member 71 having the electrodes 83 and 84, which are identical to each other, a sintered body (see FIG. 12) is obtained by stacking respective ceramic green sheets alernately with the above-mentioned electrodes, as shown in FIGS. 11(a)–11(f) and then baking the same. An electrical connection arrangement of the device of FIG. 12 is shown in FIG. 13. As shown, voltages of −V volts, V volts and zero volts are applied to extracting electrodes 91 and 92 and an electrode 86 respectively, so that the respective ceramic layers are polarized in the directions shown by arrows in FIG. 13. Then, the monolithic bimorph member 71 as shown in FIG. 9 can be obtained by connecting the extracting electrodes 91 and 92 by a conductive part 93. FIG. 10 shows an electrical connection arrangement of the monolithic bimorph member 71.

In the embodiment as shown in FIGS. 8 to 13, the central ceramic layer 95 is not polarized. The electrodes 83 and 84 vertically positioned above and below the ceramic layers 95 are at the same potential in driving. Therefore, the ceramic layer 95 does not contribute to the bending of the monolithic bimorph member 71. Thus, even if an odd number of the ceramic layers are provided, the bending of the monolithic bimorph member 71 in the vertical direction in FIG. 8 is uniform, since the ceramic layers contributing to bending are equal in number. Further, the ceramic layer 95 not contributing to the displacement is adapted to relax stress concentration caused by reverse expansion/contraction of the upper and lower ceramic layers. Thus, the monolithic bimorph member 71 can further accurately drive the magnetic head 72.

Description will now be made of the results of experiments carried out in practice.

The monolithic bimorph members 31 and 71 according to the embodiments as shown in FIGS. 1 and 8 were manufactured as follows: The electrodes 52 to 54 and 82 to 85 serving as inner electrodes were formed with palladium paste. The upper and lower electrodes 51, 55, 81 and 86 and the extracting electrodes 47, 49, 91 and 92 were formed with Ag baking, in order to prompt connection, particularly soldering of lead wires. The conductive parts 57 and 93 for connecting the extracting electrodes 47, 49, 91 and 92 were formed with a coating of conductive paint.

Ceramic green sheets that were 100 μm (75 μm after sintering) in thickness were employed in both of the monolithic bimorph members 31 and 71. Four such ceramic green sheets were stacked in the embodiment of FIG. 1 and five ceramic green sheets were stacked in the embodiment of FIG. 8 to obtain green chips. The overall sizes of the ceramic sintered bodies thus obtained were 5×12×0.3 mm in the embodiment of FIG. 1 and 5×12×0.375 mm in the embodiment of FIG. 8.

The aforementioned ceramic green sheets were prepared from $Pb(Ni,Nb,Fe)O_3$-$PbTiO_3$-$PbZrO_3$ ceramics of dielectric constant $\epsilon = 4000$ and $d_{31} = 280 \times 10^{-12}$ C/N.

The monolithic bimorph members 31 and 71 thus obtained were bonded to support members with conductive bonding agents and then changes in the positions of the forward ends thereof were measured. In another arrangement, magnetic heads of ferrite were separately bonded to the forward ends of the monolithic bimorph members 31 and 71, whose other ends were bonded to support members, and then the positions of the forward ends of the magnetic head with reference to the vertical positions of the support members were measured. The following Table shows the results of such experiments.

Figure 14:
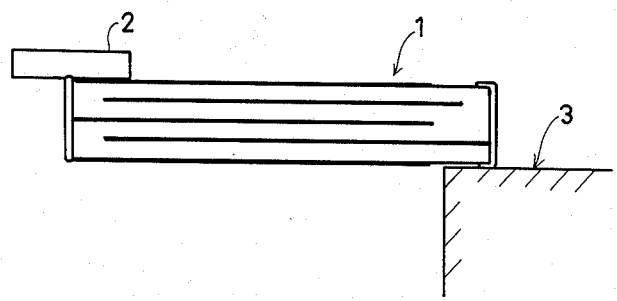
FIG. 14 is a side elevational view showing a conventional magnetic head driving mechanism.
Figure 15:
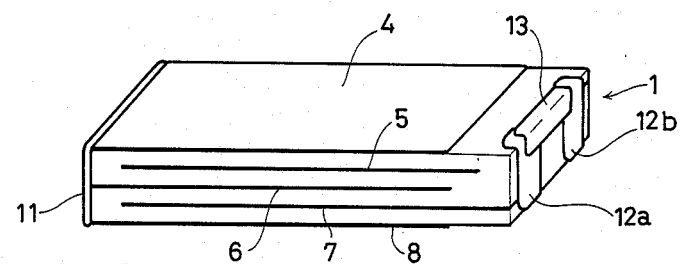
FIG. 15 is a perspective view illustrating the conventional structure of FIG. 14.
Figure 16:
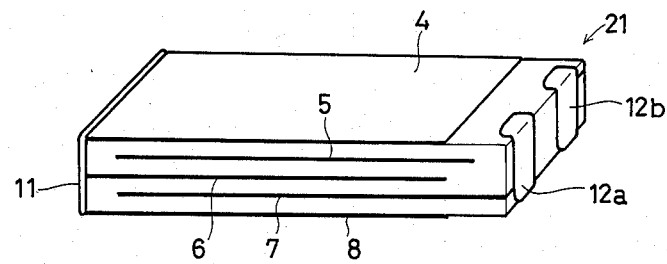
FIG. 16 is a perspective view showing a structural arrangement for carrying out polarization of the monolithic bimorph member as shown in FIG. 15.
Figure 17:
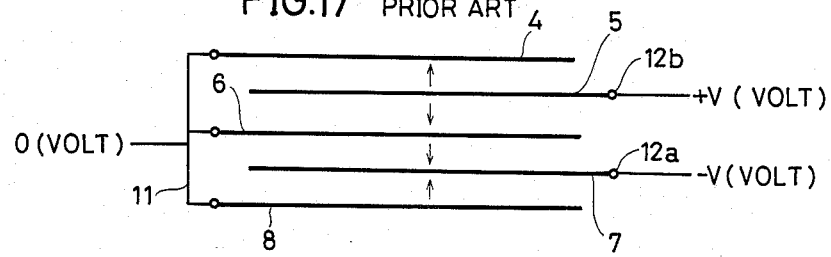
FIG. 17 typically illustrates an electrical connection arrangement for performing polarization in the structure shown in FIG. 16.
Figure 18:
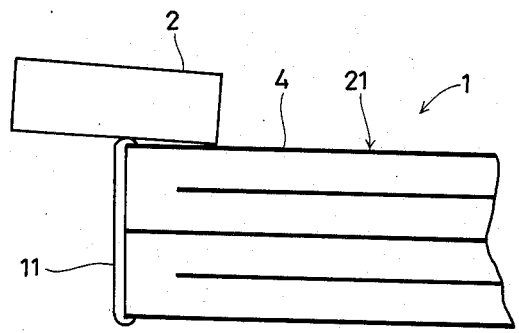
FIG. 18 is an enlarged side elevational view illustrating a problem in the conventional structure as shown in FIG. 14.
Figure 19:
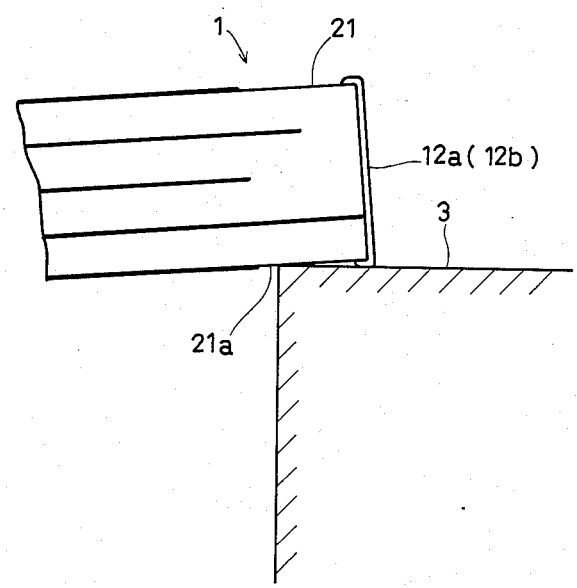
FIG. 19 is an enlarged side elevational view illustrating another problem of the conventional structure as shown in FIG. 14.

For the purpose of comparison, similar measurement was performed of the vertical position of a magnetic head in the conventional apparatus as shown in FIG. 14. The following Table also shows the result.

TABLE

| | Displacement from Reference Position (mm) | X | n − 1 |
|---|---|---|---|
| Prior Art | 0.10, 0.12, 0.23, 0.15, 0.20 | 0.16 | 0.05 |
| Embodiment 1* | 0.05, 0.03, 0.02, 0.04, 0.02 | 0.03 | 0.01 |

| TABLE-continued | | | |
|---|---|---|---|
| | Displacement from Reference Position (mm) | X | n − 1 |
| Embodiment 2* | 0.04, 0.03, 0.05, 0.02, 0.01 | 0.03 | 0.01 |

*1: bimorph member being fixed to support member
*2: bimorph member provided with magnetic head being fixed to support member It is seen from the above Table that displacement from the reference position of a support member can be extremely improved to about 1/5 with variation of about 1/5 according to the embodiments of the structure of the present invention.

Although embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. A magnetic head driving apparatus comprising:
   a monolithic bimorph member having a first end with a magnetic head fixed thereto; and
   a support member having a second end of said monolithic bimorph member fixed thereto to support the same,
   said monolithic bimorph member comprising a piezoelectric ceramic sintered body which includes a plurality of electrodes stacked alternately with a plurality of ceramic layers, said plurality of electrodes including a first electrode group for connection to a first potential and a second electrode group for connection to a second potential, for driving the monolithic bimorph member,
   respective ones of said electrodes, which form each of said electrode groups, being electrically connected with each other by conductive paths which comprise conductive paste material disposed continuously in corresponding adjacent through holes in said electrodes and ceramic layers,
   wherein the ones of said through holes which connect said electrodes of at least one of said first electrode group or said second electrode group, are formed spaced away from said first end to which said magnetic head is fixed, and are in the vicinity of said second end of said monolithic bimorph member, which second end is fixed to said support member.

2. A magnetic head driving apparatus in accordance with claim 1, wherein said monolithic bimorph member has a substantially flat first fixing portion to which said magnetic head is fixed with a secure surface-to-surface contact.

3. A magnetic head driving apparatus in accordance with claim 2, wherein said monolithic bimorph member has a substantially flat second fixing portion which is fixed to said support member with a secure surface-to-surface contact.

4. A magnetic head driving apparatus in accordance with claim 3, wherein said surface-to-surface contact is conductive.

5. A magnetic head driving apparatus in accordance with claim 1, wherein said support member comprises a conductive material and is electrically connected to one of said first electrode group or said second electrode group.

6. A magnetic head driving apparatus in accordance with claim 1, wherein said monolithic bimorph member has a pair of outer electrodes formed on two major surfaces on both sides of the monolithic bimorph member in the direction of thickness, said outer electrodes both being comprised in one of said first or second electrode group, and being electrically connected with each other.

7. A magnetic head driving apparatus in accordance with claim 6, wherein said outer electrodes are connectable to ground for driving said monolithic bimorph member.

8. A magnetic head driving apparatus in accordance with claim 1, wherein said monolithic bimorph member comprises an odd number of said ceramic layers, a central one of said layers being a non-driven relaxation layer in the center of said monolithic bimorph member in the direction of thickness for relaxing stress concentration caused by reverse expansion/contraction of said ceramic layers provided on both sides thereof.

9. A magnetic head driving apparatus in accordance with claim 1, wherein said monolithic bimorph member has a substantially flat second fixing portion which is fixed to said support member with a secure surface-to-surface contact.

10. A magnetic head driving apparatus in accordance with claim 9, wherein said surface-to-surface contact is conductive.

11. A magnetic head driving apparatus in accordance with claim 1, wherein said conductive paste material is coated on an inner peripheral surface of each said through-hole.

* * * * *